United States Patent [19]

Liu

[11] Patent Number: 5,514,617
[45] Date of Patent: May 7, 1996

[54] METHOD OF MAKING A VARIABLE RESISTANCE POLYSILICON CONDUCTOR FOR AN SRAM DEVICE

[75] Inventor: Chwen-Ming Liu, Shinchu, Taiwan

[73] Assignee: Taiwan Semiconductor Manufacturing Co. Ltd., Hsin-Chu, Taiwan

[21] Appl. No.: 266,504

[22] Filed: Jun. 27, 1994

[51] Int. Cl.$^6$ .............................. H01L 21/70; H01L 27/00
[52] U.S. Cl. .................. 437/60; 437/52; 437/918; 148/DIG. 136
[58] Field of Search .................. 437/918, 47, 52, 437/60, 192; 148/DIG. 136; 257/359, 379, 380, 538, 903–904

[56] References Cited

U.S. PATENT DOCUMENTS 4,408,385 10/1983 Mohan Rao et al. ............... 437/918
5,200,356 4/1993 Tanaka ................................ 437/60
5,268,325 12/1993 Spinner, III et al. ................ 437/60
5,275,963 1/1994 Cederkaum et al. ............... 437/48

Primary Examiner—H. Jey Tsai
Attorney, Agent, or Firm—George O. Saile; Graham S. Jones, II

[57] ABSTRACT

A device and a method of manufacture of a semiconductor device on a semiconductor substrate including an SRAM cell with a resistor comprises forming a first polycrystalline silicon containing layer on the semiconductor substrate, patterning and etching the first polycrystalline silicon containing layer to form steps on either side thereof, forming a dielectric layer over the first polycrystalline silicon containing layer with the steps on either side of the first polycrystalline silicon containing layer, forming a blanket of a second polycrystalline silicon containing layer extending over the interpolysilicon layer, and ion implanting the second polycrystalline silicon containing layer in a blanket implant of a light dose of dopant including ion implanting resistive regions with far higher resistivity in the regions over the steps.

12 Claims, 4 Drawing Sheets

METHOD OF MAKING A VARIABLE RESISTANCE POLYSILICON CONDUCTOR FOR AN SRAM DEVICE

BACKGROUND OF THE INVENTION

1. Field of the Invention

This invention relates to SRAM devices and more particularly to resistors therefor.

2. Description of Related Art

The polysilicon load is a key module of a four transistor (4T) plus two resistor (2R) SRAM process. The load length is more and more critical in the process of manufacture of submicron devices due the scaling of the load length, since, paradoxically, the resistance is a function of length, yet the length is decreased as the scale of the device decreases.

U.S. Pat. No. 5,268,325 of Spinner et al for "Method for Fabricating a Polycrystalline Silicon Resistive Load Element in an Integrated Circuit" shows an increase of topography with spacers. The resistors are located directly over the flat areas of the device as indicated by the narrower brackets on either side of the drawings, as described at Col. 3, lines 49–61 and Col. 4, lines 18–20 and lines 39–43, etc.

SUMMARY OF THE INVENTION

Using the step height of a polysilicon gate under a polysilicon load or whatever layers are under the polysilicon load, the load length can increase so long as the height of the layer remains under the polysilicon load. Not only is the load length increased, but also the dopant distribution is changed within the portion of the increased length which is possible to reduce length down to 1 µm region drawn dimension.

In accordance with this invention, a device and a method of manufacture of a semiconductor device on a semiconductor substrate including an SRAM cell with a resistor comprises forming a first polycrystalline silicon containing layer on the semiconductor substrate, patterning and etching the first polycrystalline silicon containing layer to form steps on either side thereof, forming a dielectric layer over the first polycrystalline silicon containing layer with the steps on either side of the first polycrystalline silicon containing layer, forming a blanket of a second polycrystalline silicon containing layer extending over the interpolysilicon layer, and ion implanting the second polycrystalline silicon containing layer in a blanket implant of a light dose of dopant including ion implanting resistive regions with far higher resistivity in the regions over the steps.

Preferably, the dopant is selected from arsenic, phosphorus, boron, and $BF_2$ ions implanted within the range from about $1E13cm^{-2}$ to about $1E14cm^{-2}$; the implant of a light dose of dopant into the second polycrystalline silicon containing layer is applied at from about 20 keV to about 100 keV.

Alternatively, it is preferred that the implant of a light dose of dopant into the second polycrystalline silicon containing layer comprises an arsenic dopant implanted within the range from about $2E13cm^{-2}$ to about $1E14cm^{-2}$.

Preferably, the first polycrystalline silicon containing layer has a thickness from about 2,000 Å to about 5,000 Å; the second polycrystalline silicon containing layer has a thickness from about 300 Å to about 1,500 Å; the dielectric layer comprises a silicon dioxide layer having a thickness from about 500 Å to about 3,000 Å; contacts are formed by the steps comprising forming a contact mask on the device, doping a contact dopant through the contact mask, and depositing metallization through the mask; and the dose comprises phosphorus ions implanted within the range from about $2E14cm^{-2}$ to about $5E15cm^{-2}$.

In another aspect of this invention, a semiconductor device on a semiconductor substrate including an SRAM cell with a resistor comprises a first polycrystalline silicon containing layer on the semiconductor substrate patterned with steps on either side thereof, a dielectric layer over the first polycrystalline silicon containing layer with the steps on either side of the first polycrystalline silicon containing layer, a blanket polycrystalline silicon containing layer extending over the dielectric layer, the ion implanted in the polycrystalline silicon containing layer in a blanket implant of a light dose of dopant including ion implanting resistive regions with far higher resistivity in the regions over the steps; the light dose of dopant is selected from arsenic, phosphorus, boron, and $BF_2$ ions implanted within the range from about $1E13cm^{-2}$ to about $1E14cm^{-2}$.

Alternatively, the light dose comprises arsenic ions implanted within the range from about $2E14cm^{-2}$ to about $5E15cm^{-2}$; and the first polycrystalline silicon containing layer has a thickness from about 2,000 Å to about 5,000 Å; the second polycrystalline silicon containing layer has a thickness from about 300 Å to about 1,500 Å and the dielectric layer has a thickness from about 500 Å to about 3,000 Å; and contacts are formed on the device, into a region doped with a dose comprising phosphorus ions implanted within the range from about $2E14cm^{-2}$ to about $5E15cm^{-2}$.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
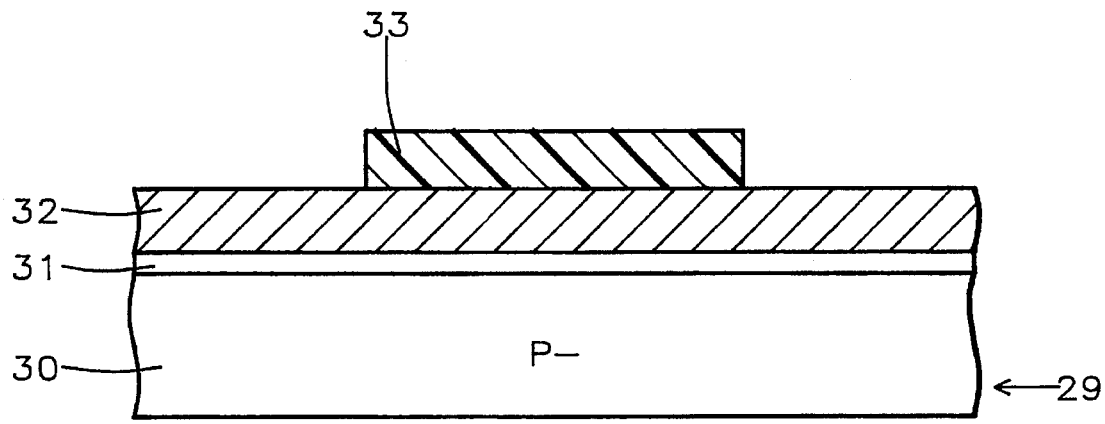
FIG. 1 shows a sectional view of a VLSI device in accordance with this invention in an early phase of the process of manufacture of that device.

FIG. 1 shows a sectional view of a VLSI device in accordance with this invention in an early phase of the process of manufacture of that device. A P- silicon substrate is covered with a gate oxide layer 31 which in turn is coated with a first polycrystalline silicon layer comprising a control gate layer 32. Layer 32 is preferably composed of polysilicon 1 or polycide having a preferred thickness from about 2,000 Å to about 5000 Å. A photoresist mask 33 has been applied and patterned by conventional photolithographic techniques.

Figure 2:
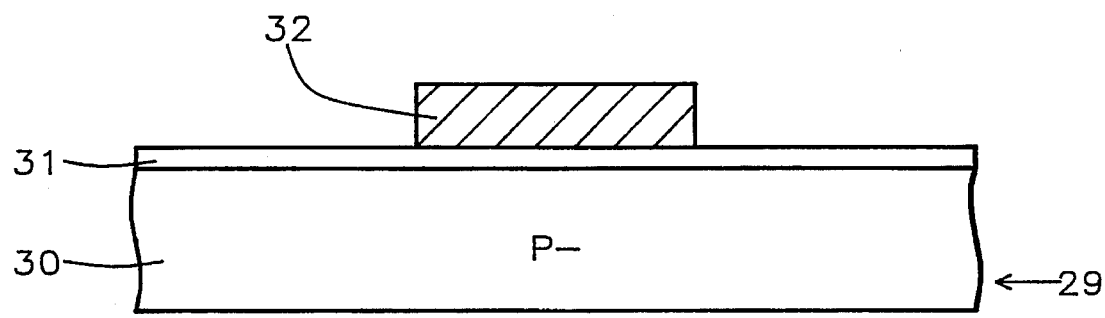
FIG. 2 shows the device of FIG. 1 with the first polycrystalline containing layer etched by a conventional etchant for the polysilicon or polycide, etc. used to form a control gate.

FIG. 2 shows a device of FIG. 1 with the first polycrystalline silicon layer layer 32 etched by a conventional etchant for the polysilicon or polycide, etc. used to form a control gate 32.

Figure 3:
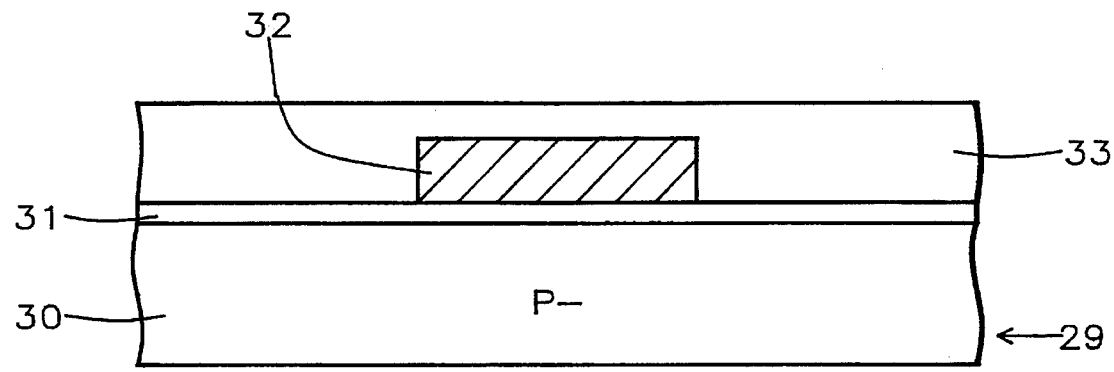
FIG. 3 shown the device of FIG. 2 after a spacer layer of silicon dioxide has been formed.

FIG. 3 shown the device of FIG. 2 after a spacer layer 33 of silicon dioxide has been formed by a conventional process.

Figure 4:
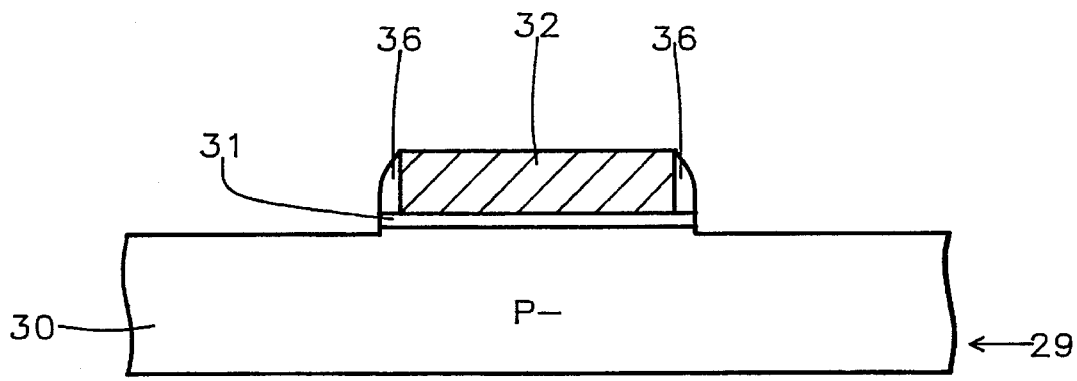
FIG. 4 shows the device of FIG. 3 after the spacer layer has been etched with an etchant for silicon dioxide which leaves the spacers, but removes the gate oxide layer except under the spacers and the control gate.

FIG. 4 shows the device of FIG. 3 after the spacer layer 36 has been etched with an etchant for silicon dioxide which leaves the spacers 36, but removes the gate oxide layer 31 except under the spacers 36 and the control gate 32. It can be seen that the substrate 30 has been etched slightly by the etchant.

Figure 5:
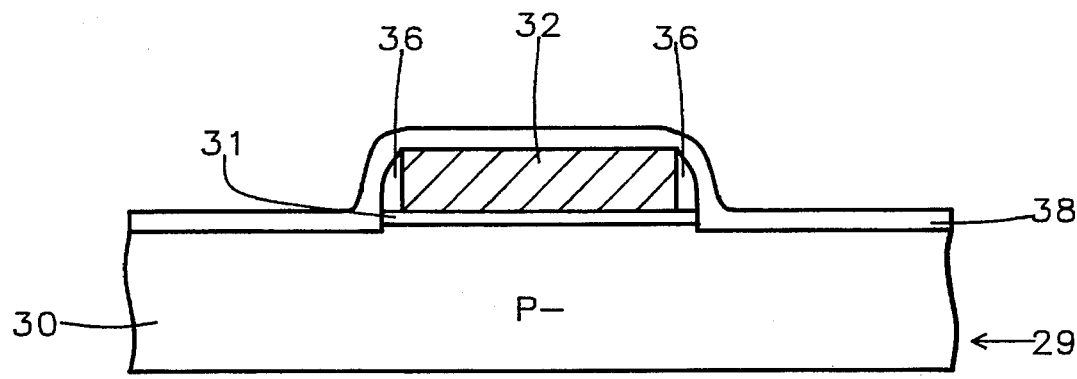
FIG. 5 shows the device of FIG. 4 after an interpolysilicon dielectric layer has been applied to the device.

FIG. 5 shows the device in FIG. 4 after an interpolysilicon dielectric layer 38 has been applied to the device. Dielectric layer 38 preferably comprises silicon dioxide $SiO_2$ formed by LPCVD (Low Pressure Chemical Vapor Deposition) decomposition of TEOS (Tetraethoxysilane $Si(OC_2H_5)_4$ at from 650° C. to 750° C. The preferred silicon dioxide dielectric layer has a preferred thickness from about 500 Å to about 3,000 Å.

Figure 6:
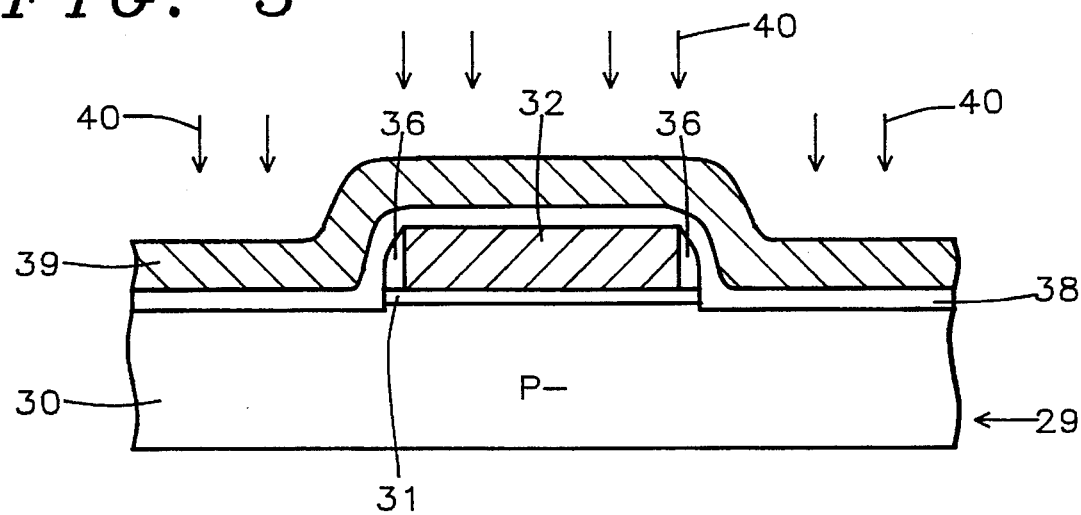
FIG. 6 shows a polycrystalline silicon containing layer above the interpolysilicon layer being lightly doped with a blanket ion implantation with N or P ions.

In FIG. 6, above the interpolysilicon layer 38, a polycrystalline silicon containing layer 39 composed of a material (selected from polysilicon 2 and polycide) is formed having a preferred thickness from about 300 Å to about 1,500 Å. Then the device is lightly doped with a blanket ion implantation with N or P ions 40 composed preferably of arsenic and alternatively of phosphorous, boron, or $BF_2$ applied with a dose of about $1 \times 10E\ 13cm^{-2}$ to about $1 \times 10E14cm^{-2}$. For arsenic, it is implanted at an energy of from about 20 keV to about 100 keV in a medium current implanter type of tool.

The chemical species of the dopant implanted can be arsenic with a dose of from about $2\ E13cm^{-2}$ to about $1\ E14cm^{-2}$, at an energy of from about 20 keV to about 80 keV as a function of the thickness of the polysilicon 2 or polycide layer 39. The implanted dopant is in the upper half to the middle of the polysilicon 2 or polycide layer 39.

In the flat areas all of layer 39 (composed of material selected from polysilicon 2 and polycide) is subjected to the same implant dose in FIG. 6. Where there is a step, as in regions 43 and 43', the effective length of layer 39 will be longer than in the flat areas 39, 42, 42' in FIG. 7 as the control gate polycrystalline silicon layer 32 has a thickness ranging from about 2,000 Å to about 5,000 Å. Thus $R_{s(flat)}$= constant1 value in the flat areas, and a $R_{s(step)}$=constant2

Note that while one usually would use the edge of a gate electrode to provide the step for the resistor in the layer 39, as an alternative, one can use a step other than the gate electrode. The step height is very close to the height of the gate electrode; and the step height falls within a range either greater than or less than a gate electrode in physical height.

It is preferred that the polysilicon 1 layer 32 has a thickness from about 2,000 Å to about 5,000 Å, and that the polysilicon 2 layer 39 has a thickness from about 300 Å to about 1,500 Å whereby the value of the resistance is as follows:

$R_s$ load with two steps (polysilicon 1 step): 1580 gigaohms/square (L/W=2.8/0.55)

$R_s$ load without steps
~100 gigaohms/square

The condition is arsenic (As) 45 k $9E13cm^{-2}$ with a polysilicon 2 or polycide layer thickness of about 1,000 Å.

The factors concerning the step height are as follows:

1) The polysilicon 1 layer 32 determines the step height.

2) If the step height of the polysilicon 1 layer 32 is less than 2,000 Å, $R_s$ becomes high a time delay is produced.

3) If the step height is greater than 5,000 Å topography induced polysilicon 2 or polycide layer 39 then problems are caused including production of an unwanted etching stringers. In addition, there is the problem that planarization of the backend process is difficult because of such a large step.

Figure 7:
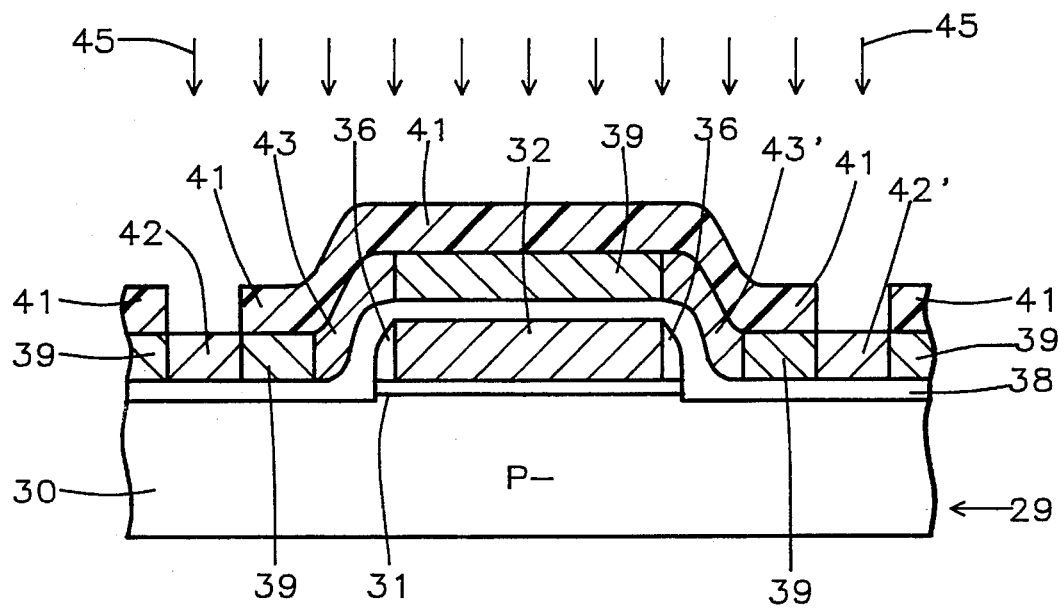
FIG. 7 shows the device of FIG. 6 after it has been coated with a photoresist pattern through which ions are implanted to apply heavy doping into contact regions to which electrical contact is to be made subsequently.

FIG. 7 shows the device of FIG. 6 after it has been coated with a photoresist pattern 41 through which ions 45 are implanted to apply heavy doping into contact regions 42, 42' to which electrical contact is to be made subsequently.

The chemical species of the dopant 45 implanted into the contact regions 42, 42' is preferably phosphorous with a dose of from about $2\ E14cm^{-2}$ to about $5\ E15cm^{-2}$, at an energy of from about 20 keV to about 130 keV.

Figure 8:
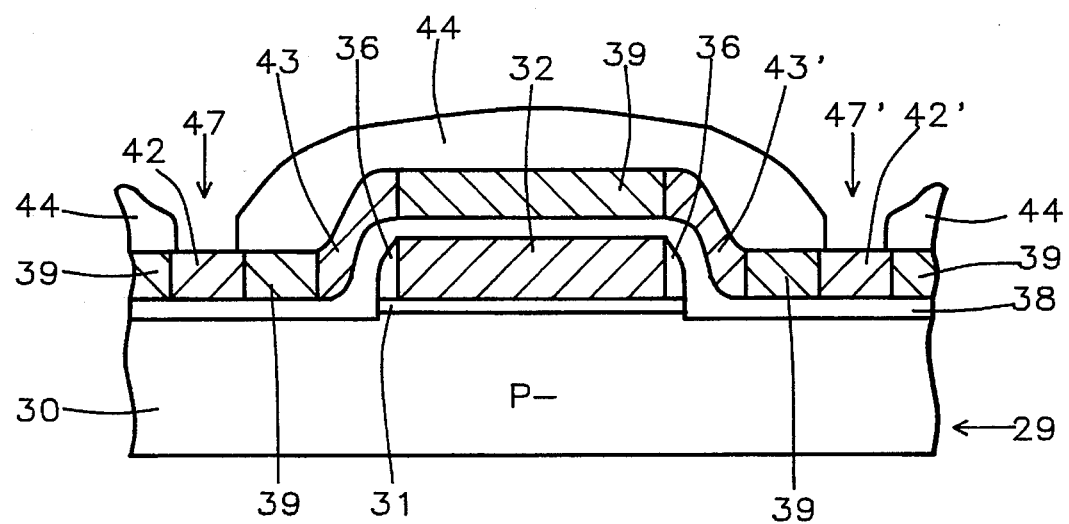
FIG. 8 shows the device of FIG. 7 after a BPSG layer has been applied, and patterned with by photolithography followed by etching layer to form openings to the surface of contacts by metal vias deposited into those openings.

FIG. 8 shows the device of FIG. 7 after a BPSG layer 44 has been applied, and patterned with by photolithography followed by etching layer 44 to form openings 47, 47' down to the surface of contacts 42, 42'. by the metal vias 46, 46' deposited into those openings 47, 47'.

Figure 9:
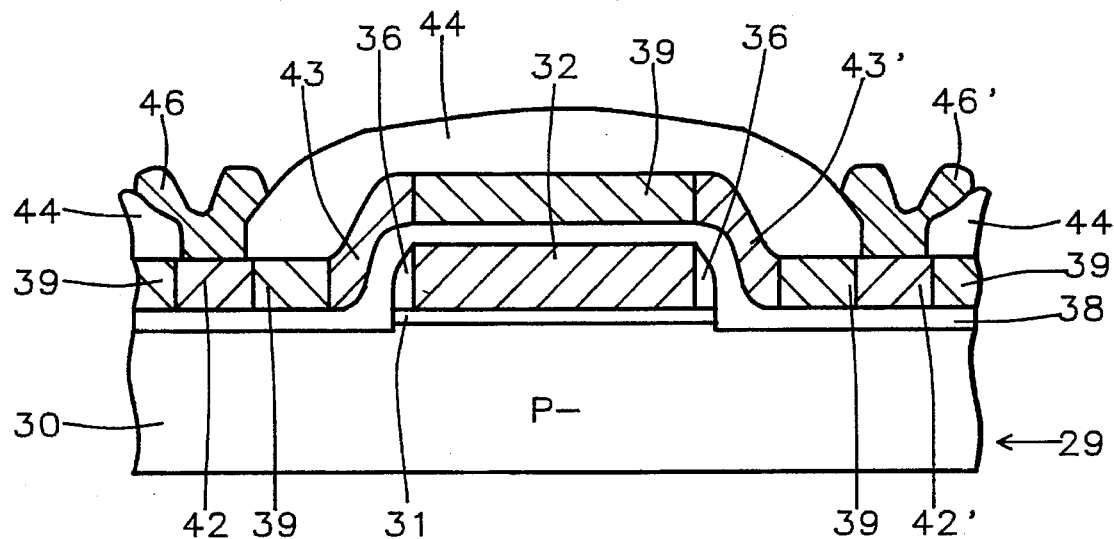
FIG. 9 shows the device of FIG. 8 after depositing metal vias into openings through BPSG layer down into contact with the surface of contacts.

FIG. 9 shows the device of FIG. 8 after depositing metal vias 46, 46' into openings 47, 47' through BPSG layer 44 down into mechanical and electrical contact with the surface of contacts 42, 42'.

Figure 10:
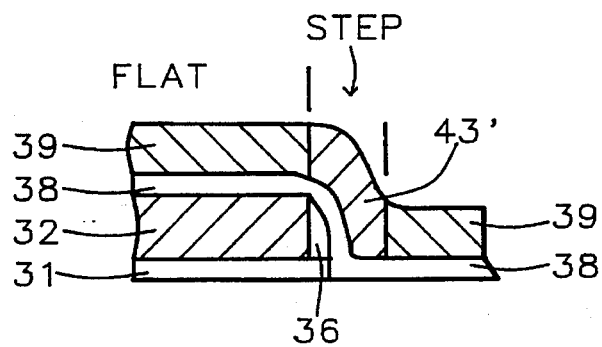
FIG. 10 shows a fragment of the device of FIG. 7 to illustrate the doping of resistor region of polycrystalline silicon containing layer composed of a material (selected from polysilicon 2 and polycide).

FIG. 10 shows a fragment of the device of FIG. 7 to illustrate the doping of resistor region 43' of polycrystalline silicon containing layer 39 composed of a material (selected from polysilicon 2 and polycide). Resistor region 43' is located at a step at the edge of the gate 32, above and to the right of the right hand spacer 36, which is the only one shown, for purposes of illustration.

Figure 11:
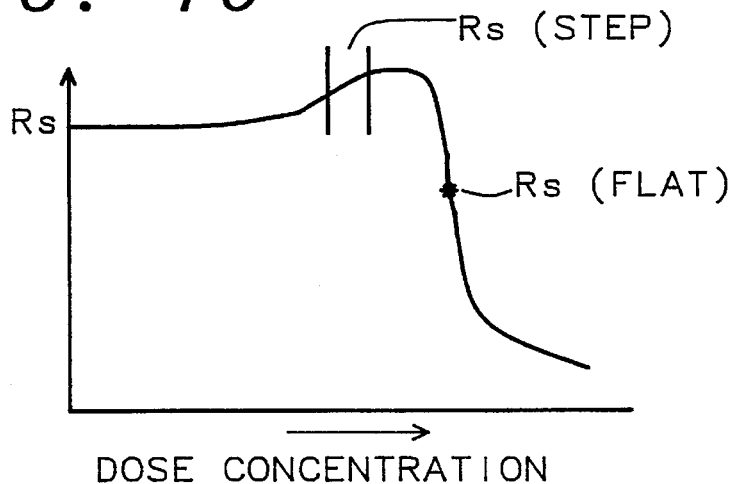
FIG. 11 shows $R_s$ load as a function of the blanket dose concentration of the light dose of arsenic ions applied in FIG. 6, with the $R_s$ (STEP) in the step area and $R_s$ (FLAT) in the flat area shown with the $R_s$ (STEP) having a significantly higher value since the dopant is spread over a longer distance at the step.

FIG. 11 shows $R_s$ load as a function of the blanket dose concentration of the light dose or arsenic ions applied in FIG. 6, with the $R_s$ (STEP) in the step area and $R_s$ (FLAT) in the flat area shown with the $R_s$ (STEP) having a significantly higher value since the dopant is spread over a longer distance at the step.

Summary

There are three points which are key to this invention which are as follows:

1) The step height makes the effective length of the resistor longer.
2) The step makes the concentration in the step area less than that of the flat area which leads to the inequality $R_{s(step)} > R_{s(flat)}$.
3) The polysilicon load process can be shrunk to a smaller dimension while maintaining the required resistance value.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacture of a semiconductor device on a semiconductor substrate including a SRAM cell with a resistor comprising the sequence of steps as follows:

formation of a gate oxide layer on said substrate, formation of a first polycrystalline silicon containing layer on said gate oxide layer, said first polycrystalline silicon containing layer having a thickness between about 2,000 Å and about 5,000 Å, patterning and etching said first polycrystalline silicon containing layer to form a control gate, forming a spacer layer of silicon dioxide over said device and etching said spacer layer to form spacers adjacent to said control gate and etching away portions of said gate oxide layer and etching said substrate to form steps on either side of said control gate, formation of a dielectric layer over said substrate with said steps on either side of said control gate and said spacers said dielectric layer having a thickness between about 500 Å and about 3,000 Å, formation of a blanket of a second polycrystalline silicon containing layer extending over said dielectric layer including said steps, said second polycrystalline silicon containing layer having a thickness between about 300 Å and about 1,500 Å, and ion implanting said second polycrystalline silicon containing layer in a blanket implant of a first dose of dopant to form a resistor including ion implanting resistive regions with higher resistivity in regions over said steps because of said steps on either side of said control gate, and forming contact regions in said resistor and metal vias on both sides of said control gate connected to said contact regions.

2. The method of claim 1 wherein said first dose of dopant is selected from the group consisting of arsenic, phosphorus, boron, and BF$_2$ ions, said ions being implanted within the range from about 10E13cm$^{-2}$ to about 10E14cm$^{-2}$.

3. The method of claim 1 wherein said implant of said first dose of dopant into said second polycrystalline silicon containing layer is applied at from about 20 keV to about 100 keV.

4. The method of claim 3 wherein said first dose of dopant comprises arsenic ions implanted within the range from about 2E13cm$^{-2}$ to about 1E14cm$^{-2}$.

5. The method of claim 1 wherein contact regions are formed by the steps comprising forming a contact mask on said device, doping a contact dopant through said contact mask, and depositing metallization through said mask.

6. The method of claim 5 wherein said contact dopant comprises phosphorus ions implanted within the range from about 2E14cm$^{-2}$ to about 5E15cm$^{-2}$.

7. A method of manufacture of a semiconductor device on a semiconductor substrate including a SRAM cell with a resistor comprising formation of a gate oxide layer on said substrate, formation of a first polycrystalline silicon containing layer on said gate oxide layer, said first polycrystalline silicon containing layer having a thickness between about 2,000 Å and about 5,000 Å, patterning and etching said first polycrystalline silicon containing layer to form a control gate, forming a spacer layer of silicon dioxide over said device and etching said spacer layer to form spacers adjacent to said control gate and said etching etching away portions of said gate oxide layer and etching said substrate to form steps on either side of said control gate, formation of a dielectric layer over said substrate with said steps on either side of said control gate and said spacers said dielectric layer having a thickness between about 500 Å and about 3,000 Å, formation of a blanket of a second polycrystalline silicon containing layer extending over said dielectric layer including said steps, said second polycrystalline silicon containing layer having a thickness between about 300 Å and about 1,500 Å, ion implanting said second polycrystalline silicon containing layer in a blanket implant of a first dose of dopant to form a resistor including ion implanting resistive regions with higher resistivity in regions over said steps because of said steps on either side of said control gate, forming a mask over said device with contact openings over flat areas of said second polycrystalline silicon which overlie said substrate and doping dopant into said contact openings to form contacts below said contact openings in said flat areas on both sides of said control gate, forming a BPSG layer over said device and forming via openings in said BPSG layer over said contacts, and forming metal vias into said via openings.

8. The method of manufacture of a semiconductor device in accordance with claim 7 wherein said first dose of dopant is selected from the group consisting of arsenic, phosphorus, boron, and BF$_2$ ions, said ions being implanted within the range from about 10E13 cm$^{-2}$ to about 10E14 cm$^{-2}$.

9. The method of manufacture of a semiconductor device in accordance with claim 7 wherein said implant of said first dose of dopant into said second polycrystalline silicon containing layer is applied at from about 20 keV to about 100 keV.

10. The method of manufacture of a semiconductor device in accordance with claim 7 wherein said first dose of dopant is selected from the group consisting of arsenic, phosphorus, boron, and BF$_2$ ions, said ions being implanted within the range from about 10E13 cm$^{-2}$ to about 10E14 cm$^{-2}$ and said implant of said first dose of dopant into said second polycrystalline silicon containing layer is applied at from about 20 keV to about 100 keV.

11. The method of manufacture of a semiconductor device in accordance with claim 7 wherein said first dose of dopant comprises arsenic ions implanted within the range from about 2E13 cm$^{-2}$ to about 1E14 cm$^{-2}$.

12. The method of manufacture of a semiconductor device in accordance with claim 7 wherein said first dose of dopant comprises arsenic ions implanted within the range from about 2E13 cm$^{-2}$ to about 1E14 cm$^{-2}$, and said implant of said first dose of dopant into said second polycrystalline silicon containing layer is applied at from about 20 keV to about 80 keV.

\* \* \* \* \*